(12) United States Patent
Dinh et al.

(10) Patent No.: US 9,007,808 B1
(45) Date of Patent: Apr. 14, 2015

(54) SAFEGUARDING DATA THROUGH AN SMT PROCESS

(71) Applicant: Adesto Technologies Corporation, Sunnyvale, CA (US)

(72) Inventors: John Dinh, Dublin, CA (US); Derric Lewis, Sunnyvale, CA (US); Venkatesh P. Gopinath, Fremont, CA (US); Deepak Kamalanathan, Santa Clara, CA (US); Shane C. Hollmer, Grass Valley, CA (US); Juan Pablo Saenz Echeverry, Mountain View, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 383 days.

(21) Appl. No.: 13/628,385

(22) Filed: Sep. 27, 2012

(51) Int. Cl.
*G11C 11/00* (2006.01)
*G11C 13/00* (2006.01)
*G11C 11/406* (2006.01)
*G11C 13/02* (2006.01)

(52) U.S. Cl.
CPC ...... *G11C 13/0011* (2013.01); *G11C 11/40626* (2013.01); *G11C 11/406* (2013.01); *G11C 13/004* (2013.01); *G11C 13/02* (2013.01); *G11C 13/0009* (2013.01); *G11C 11/40603* (2013.01)

(58) Field of Classification Search
CPC ............ G11C 13/0011; G11C 13/02; G11C 13/0009; G11C 13/004; G11C 11/406; G11C 11/40603; G11C 11/40626
USPC ..................... 365/148, 189.09, 222
See application file for complete search history.

(56) References Cited

U.S. PATENT DOCUMENTS

| | | | |
|---|---|---|---|
| 8,659,954 B1* | 2/2014 | Lewis et al. ............. | 365/189.011 |
| 8,730,752 B1* | 5/2014 | Kamalanathan et al. ..... | 365/226 |
| 8,879,302 B2* | 11/2014 | Gaertner et al. ............... | 365/148 |
| 2005/0243596 A1* | 11/2005 | Symanczyk .................. | 365/153 |
| 2006/0265548 A1* | 11/2006 | Symanczyk et al. .......... | 711/106 |
| 2010/0110764 A1* | 5/2010 | Sun et al. ....................... | 365/148 |

* cited by examiner

*Primary Examiner* — Toan Le
(74) *Attorney, Agent, or Firm* — Michael C. Stephens, Jr.

(57) ABSTRACT

Structures and methods for recovering data in a semiconductor memory device are disclosed herein. In one embodiment, a method of recovering data in a semiconductor memory device, can include: (i) pre-conditioning a first memory cell on the semiconductor memory device by using a formation voltage to program a first data state in the first memory cell; (ii) storing a second data state in a second memory cell on the semiconductor memory device by maintaining the second memory cell in a virgin state; (iii) mounting the semiconductor memory device on a printed-circuit board (PCB) by using a high temperature process that increases a resistance of the first memory cell; and (iv) performing a recovery of the first data state by reducing the resistance of the first memory cell.

20 Claims, 13 Drawing Sheets

SAFEGUARDING DATA THROUGH AN SMT PROCESS

FIELD OF THE INVENTION

The present invention generally relates to the field of semiconductor memory. More specifically, embodiments of the present invention pertain to resistive random-access memory (ReRAM) and/or conductive bridging RAM (CBRAM) processes and devices.

BACKGROUND

Non-volatile memory (NVM) is increasingly found in applications, such as solid-state hard drives, removable digital picture cards, and so on. Flash memory is the predominant NVM technology in use today. However, flash memory has limitations, such as a relatively high programming current, as well as physical degradation of the memory cell over time. Other NVM technologies, such as resistive RAM (ReRAM) and conductive bridging RAM (CBRAM), may offer relatively low power and higher speeds as compared to flash memory technologies. CBRAM utilizes a programmable metallization cell (PMC) technology, which has the potential to scale to smaller sizes than flash memory devices.

SUMMARY

Embodiments of the present invention relate to recovering data in a semiconductor memory device after mounting to a printed-circuit board (PCB).

In one embodiment, a method of recovering data in a semiconductor memory device, can include: (i) pre-conditioning a first memory cell on the semiconductor memory device by using a formation voltage to program a first data state in the first memory cell; (ii) storing a second data state in a second memory cell on the semiconductor memory device by maintaining the second memory cell in a virgin state; (iii) mounting the semiconductor memory device on a PCB by using a high temperature process that increases a resistance of the first memory cell; and (iv) performing a recovery of the first data state by reducing the resistance of the first memory cell.

Embodiments of the present invention can advantageously provide for improved data safeguarding relative to conventional approaches. Particular embodiments are suitable for resistive random-access memory (ReRAM) and/or conductive bridging RAM (CBRAM) memory cells. These and other advantages of the present invention will become readily apparent from the detailed description of preferred embodiments below.

DETAILED DESCRIPTION OF EMBODIMENTS

Figure 1:
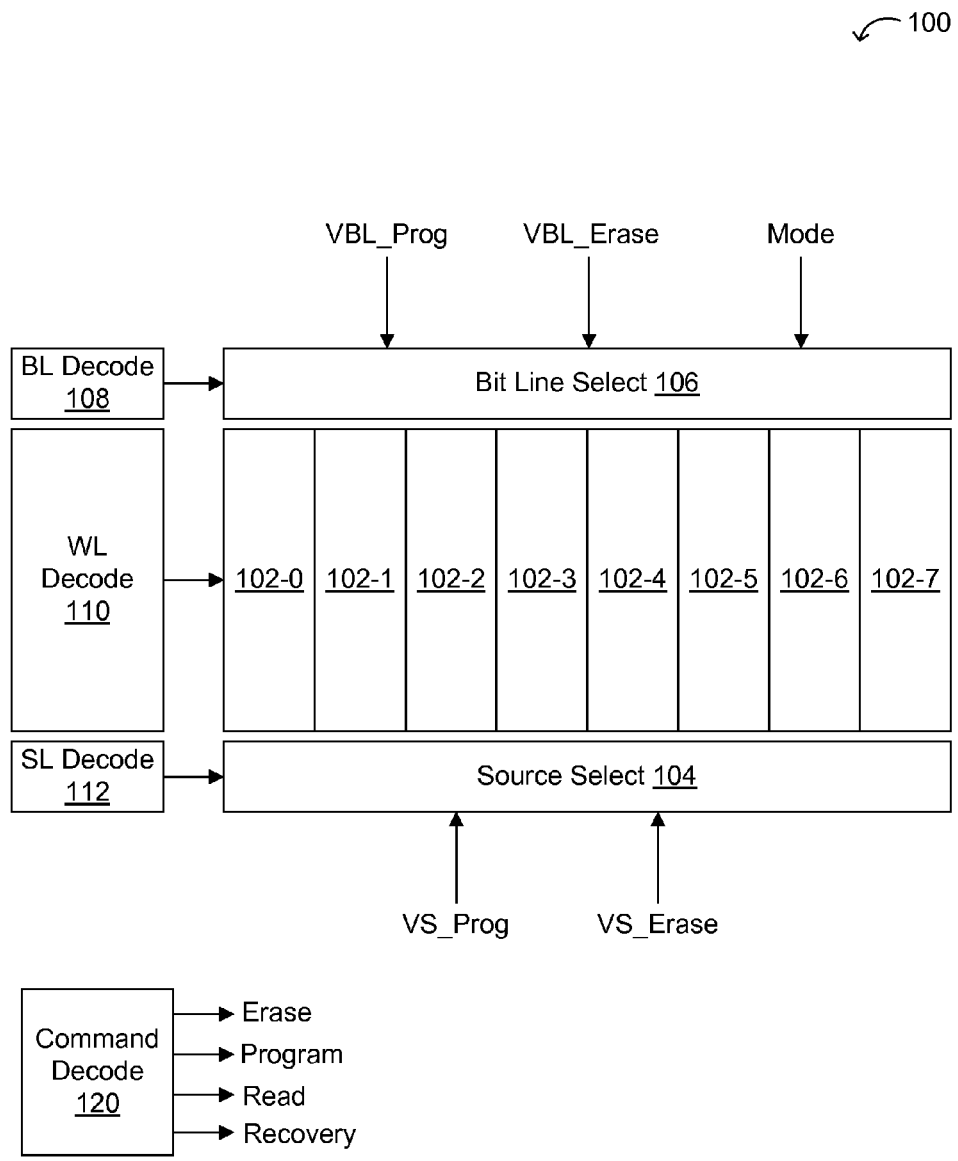
FIG. 1 is an example memory device arrangement.

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Furthermore, in the context of this application, the terms "wire," "wiring," "line," "signal," "conductor," and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Particular embodiments may be directed to programmable metallization cells (PMC). Examples of such cells are shown and described in U.S. Pat. Nos. 6,635,914 and 7,359,236. The invention, in its various aspects, will be explained in greater detail below with regard to exemplary embodiments. The embodiments show structures and methods of operating PMCs that can be programmed/written and erased between one or more resistance and/or capacitive states.

Figure 2:
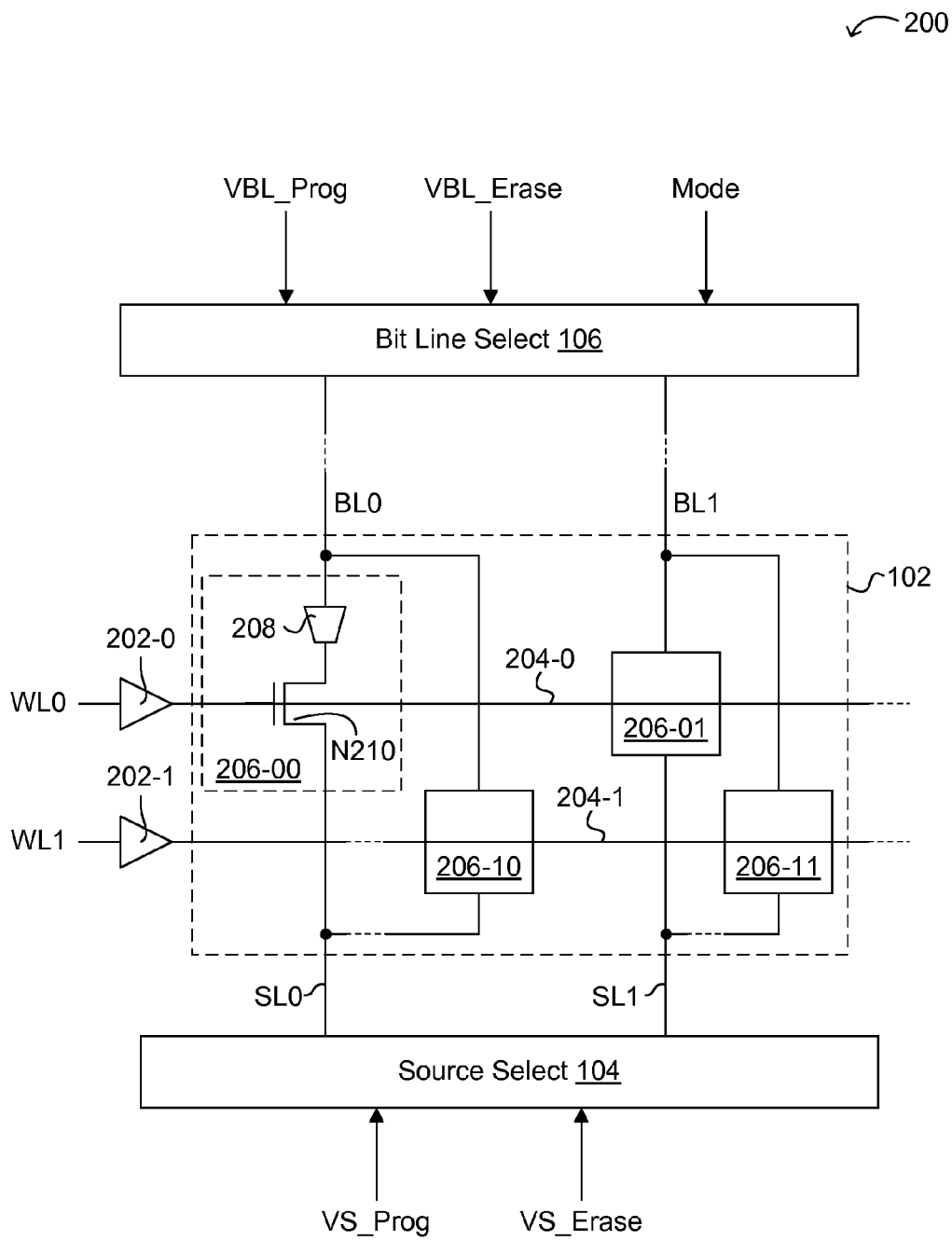
FIG. 2 is a diagram of an example memory device and memory cell structure.

FIGS. 1 and 2 show example memory architectures and circuit structures that can utilize PMCs of particular embodiments. However, PMCs of particular embodiments are suitable for use in a wide variety of memory architectures and circuit structures.

Referring now to FIG. 1, an example memory device is shown and designated by the general reference character 100. A memory device 100 can include PMC sectors 102-0 to 102-7, source node selection circuitry 104, bit line selection circuitry 106, bit line decoding circuitry 108, word line decoding circuitry 110, and source line decoding circuitry 112. A memory device 100 can be a single integrated circuit or form a portion of a larger integrated circuit device that provides functions in addition to memory, such as in an "embedded" memory configuration.

FIG. 1 may also include command decoding circuitry 120. For example, command decoding circuitry 120 may receive external signals, or control signals derived therefrom, and may generate various internal control signals (e.g., program, erase, read, recovery, etc.) in response. Such internal operation control signals can be used to generate various supply levels (e.g., particular program and erase voltage levels), as well as other control signals (e.g., recovery operation control signals), as will be discussed in more detail below. For example, a recovery command may be used to initiate recovery of data after a semiconductor memory device (e.g., including PMC-based memory cells) is mounted to a printed-circuit board (PCB). In this way, command decoding circuitry 120 may be used to determine an operation to be performed on the device.

PMC sectors (102-0 to 102-7) can each include a number of memory cells arranged into one or more columns and multiple rows. Each memory cell can include one or more PMCs and a selection device. Generally, a PMC may be configured such that when a bias greater than a threshold voltage ($Vt_{PMC}$) is applied across electrodes of the PMC, the electrical properties of the PMC can change. For example, in some arrangements, as a voltage is applied across the electrodes of the PMC, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

In particular arrangements, one electrode of a PMC can be formed of a material including a metal that dissolves in the ion conductor when a sufficient bias is applied across the electrodes (oxidizable electrode), and the other electrode is relatively inert and does not dissolve during operation of the programmable device (an indifferent or "inert" electrode). For example, one electrode may be an anode during a write process and be comprised of a material including silver that dissolves in an ion conductor while another electrode may be a cathode during the write process and be comprised of an inert material, such as tungsten, nickel, molybdenum, platinum, metal silicides, and the like. Having at least one electrode formed of a material including a metal which dissolves in an ion conductor can facilitate maintaining a desired dissolved metal concentration within an ion conductor, which in turn, can facilitate rapid and stable electrodeposit formation within ion conductor or other electrical property change during use of a PMC. Furthermore, use of an inert material for the other electrode (cathode during a write operation) can facilitate electrodissolution of any electrodeposit that may have formed and/or return of the programmable device to an erased state after application of a sufficient voltage.

Referring still to FIG. 1, in the particular example shown, PMC sectors (102-0 to 102-7) can have a "bit line anode" configuration. That is, for each given memory cell, the anode of the corresponding PMC(s) can be connected to a bit line by a conductive connection that does not include the corresponding access device. Each such bit line may provide a read data path for the corresponding PMC. This represents just one example PMC architecture, and is in contrast to other PMC memory device architectures that have bit lines connected to a corresponding PMC via the access device of the cell. As noted above, PMCs in particular embodiments are suitable for use in any type of PMC memory device architecture.

PMC sectors (102-0 to 102-7) may also have a "strapped source line" architecture. Within each PMC sector, groups of access devices within each memory cell can have terminals formed by diffusions in an integrated circuit substrate. Groups of such diffusions can be "strapped" by a low resistance structure that provides a conductive connection between groups of such diffusion regions. Such an arrangement can be in contrast to a PMC architecture in which access devices may be directly connected to a bit line. Also, while eight PMC sectors (102-0 to 102-7) are shown in the particular example of FIG. 1, other examples may include fewer or greater numbers of PMC sectors. In FIG. 1, source node selection circuitry 104 can selectively connect source straps to various nodes depending upon the mode of operation and a source decoding value. In one particular example, source node selection circuitry 104 can connect a selected source strap between at least two different voltages, depending on whether the device is operating in a program operation or read operation, or in an erase operation.

Voltages VBL_Prog, VBL_Erase, VS_Prog, and VS_Erase may be generated power supply voltages, such +5 and 0 volts, or +3.3 and 0 volts, or +1.2 and 0 volts. In one example, such voltages may be one or more power supply voltages received at an external pin of an integrated circuit including memory device 100. In another example, such voltages may be one or more voltages generated by a voltage generator (e.g., based on a reference voltage) of an integrated circuit that includes memory device 100. In any event, such voltages may be used, either directly or indirectly, for programming (e.g., in a forward bias configuration) or erasing (e.g., in a reverse bias configuration) a PMC by applying suitable voltages across the electrodes thereof.

Bit line selection circuitry 106 can selectively connect bit lines of one or more PMC sections (102-0 to 102-7) according to a mode of operation and bit line decoding values. In one particular example, bit line selection circuitry 106 can advantageously connect a selected bit to either of voltages VBL_Prog or VBL_Erase. That is, in a program operation, a selected bit line can be connected to voltage VBL_Prog, while in an erase operation, a selected bit line can be connected to voltage VBL_Erase.

Bit line selection circuitry 106, similar to source selection circuitry 104, can connect bit lines to an inhibit voltage for PMCs that are not selected for erase or program. It is noted that an arrangement like that shown in FIG. 1 can advantageously provide program and erase voltages without having to include charge pumps or the like, to a voltage that is outside a power supply range, as may exist in other approaches. Instead, supply voltages applied across a selected PMC device can be switched between program and erase operations. In this way, program and erase can be "symmetric" operations. That is, in a programming operation, a PMC to be programmed can be connected between suitable voltages (e.g., V1−V2) in an anode-to-cathode direction. In an erase operation, a PMC to be erased can be connected between suitable voltages (e.g., V2−V1) in an anode-to-cathode direction.

In this example, voltages V1 and V2 (not shown in FIG. 1) may be applied as one or more of voltages VBL_Prog, VBL_Erase, VS_Prog, and VS_Erase. This is in contrast to architectures that maintain a constant voltage on anodes of PMCs, and then provide program and erase voltages with respect to such a common anode voltage. In such a case, a supply voltage must be equal to a program voltage plus an erase voltage (Vprog+Verase). However, in a symmetric operation according to an embodiment, a program voltage may be an erase voltage, which may both be a supply voltage (Vprog=V1−V2, Verase=V2−V1, Supply voltage=V2−V1). In any event, a suitable voltage may be applied across a PMC in order to program the cell, and a reverse such voltage may be applied across the PMC in order to erase the cell.

Bit line decoding circuitry 108 can generate values for selecting given bit lines for read, program, and erase operations. In one arrangement, in response to address information (e.g., column address data), bit line decoding circuitry 108 can generate bit line select signals for application to bit line select circuitry 106.

Word line decoding circuitry 110 can generate values for selecting a given set of memory cells by enabling access devices in one or more selected rows of PMC sections (102-0 to 102-7). In response to address information (e.g., row address data), one or more word lines can be driven to a select voltage to thereby enable the corresponding select device (e.g., a transistor) in a row of memory cells. In this way, the PMCs of the selected row can be connected to a source node. Word lines can extend in a direction different than (e.g., essentially perpendicular to) the source straps.

Source decoding circuitry 112 can generate values for selecting given source straps. In one arrangement, in response to address information (e.g., column address data), source decoding circuitry 112 can generate source select signals for application to source node select circuitry 104. Source decoding circuitry 112 can select a source strap corresponding to a same memory cell as a selected bit line, and thereby enable a program, read, or erase operation.

In this way, a memory device can include PMCs as data storage elements with anodes commonly connected to bit lines and memory cell access devices connected to strapped and decoded sources. Such select circuitry can also provide for symmetrical program and erase operations utilizing bit line decoding and source strap decoding.

Referring now to FIG. 2, shown is a schematic block diagram of an example memory device and memory cell structure, as designated by the general reference character 200. Memory device 200 can be one implementation of the example shown in FIG. 1. Memory device 200 includes a PMC sector 102 that is shown for illustration purposes by four memory cells (e.g., 206-00, 206-10, 206-01, and 206-11), arranged into four columns and two rows (e.g., corresponding to WL0 and WL1). Two memory cells are shown connected to each of two bit lines BL0 and BL1. It is understood that the arrangement can be repeated to form a much larger memory cell array structure. Each memory cell (e.g., 206-00 to 206-11) can include a PMC 208 and an access device N210, which in this example is an n-channel insulated gate field effect (hereinafter "MOS") transistor. It is noted that while FIG. 2 shows an arrangement in which one PMC is provided per memory cell, alternate embodiments may include more than one PMC per memory cell.

PMCs 208 may have a structure as described in conjunction with FIG. 1, or equivalents. In the particular example of FIG. 2, PMC sector 102 also includes word line drivers 202-0 and 202-1. Word line drivers 202-0 and 202-1 can drive corresponding word lines 204-0 and 204-1 high to thereby select a memory cell 206, thus placing its corresponding access device (e.g., N210) into a low impedance state.

Read/write control circuitry within bit line selection circuitry 106 can vary in operation according to mode values. In a program operation, a read/write circuit can connect a selected bit line to an anode program voltage. In an erase operation, a read/write circuit can connect a selected bit line to an anode erase voltage. In a read operation, a read/write circuit can connect a selected bit line to a read bias voltage. Source line selection circuitry 104 can connect one or more of corresponding source straps (e.g., SL0 and SL1) to a source program voltage (VS_Prog), a source erase voltage (VS_Erase), or to a source de-select state. The source de-select state can be a high impedance state in the case of an "isolated" bit line architecture, or alternatively, can be a de-select bias voltage, in the case of a de-select bias architecture. Source line selection circuitry 104 can vary the number of source straps commonly driven to a same state. That is, source line selection circuitry 104 can select source straps connected to but one column of memory cells, or connected to multiple such columns.

Having described the various sections of FIG. 2, one example of the operation of such a memory device will now be described with reference to an operation that accesses memory cell 206-00. Initially, word lines 204 can be driven to a de-select voltage (e.g., low) by word line drivers 202. Bit line selection circuitry 106 can place bit lines BL0 and BL1 in the de-selected state. Similarly, source line selection circuitry 104 can place source straps SL0 and SL1 in the de-select state.

In a program operation, in response to address and mode data, bit line selection signals can be used to connect bit line BL0 to read/write control circuitry. In contrast, bit line BL1 can be de-selected, and thus placed in the de-selected state. Mode selection values can result in read/write control circuitry connecting the selected bit line (e.g., BL0) to an anode program voltage. A program operation can also include source selection signals connecting source strap SL0 to a source program voltage (e.g., VS_Prog), while connecting source strap SL1 to a source de-select state. A word line driver (e.g., 202-0) corresponding to the selected memory cell can be driven to a select voltage, thereby placing the selected PMC (e.g., PMC 208 of memory cell 206-00) between suitable programming voltages.

An erase operation can occur in the same general fashion, but with the erase voltage being applied to the selected bit line and source erase voltage (e.g., VS_Erase) being applied to a selected source strap. As noted in the example of FIG. 1, in particular embodiments, such an operation can be symmetrical, such that the anode programming voltage equals VS_Erase, and the anode erase voltage equals VS_Prog. Also, while FIG. 2 shows n-channel MOS transistors as access devices, other embodiments may include different types of access devices. In such alternate embodiments, word line drivers 202 would provide appropriate voltages and/or currents to enable such access devices. In this way, bit line selection, source selection, and word line activation can be utilized to program and/or erase a PMC array having bit lines connected to anodes of PMCs within multiple memory cells.

While particular example architectures and circuits suitable for PMCs, and memory arrays formed thereof, with respect to FIGS. 1 and 2, programmable impedance elements in certain embodiments are suitable to a wide variety of architectures and/or circuit arrangements.

Figure 3:
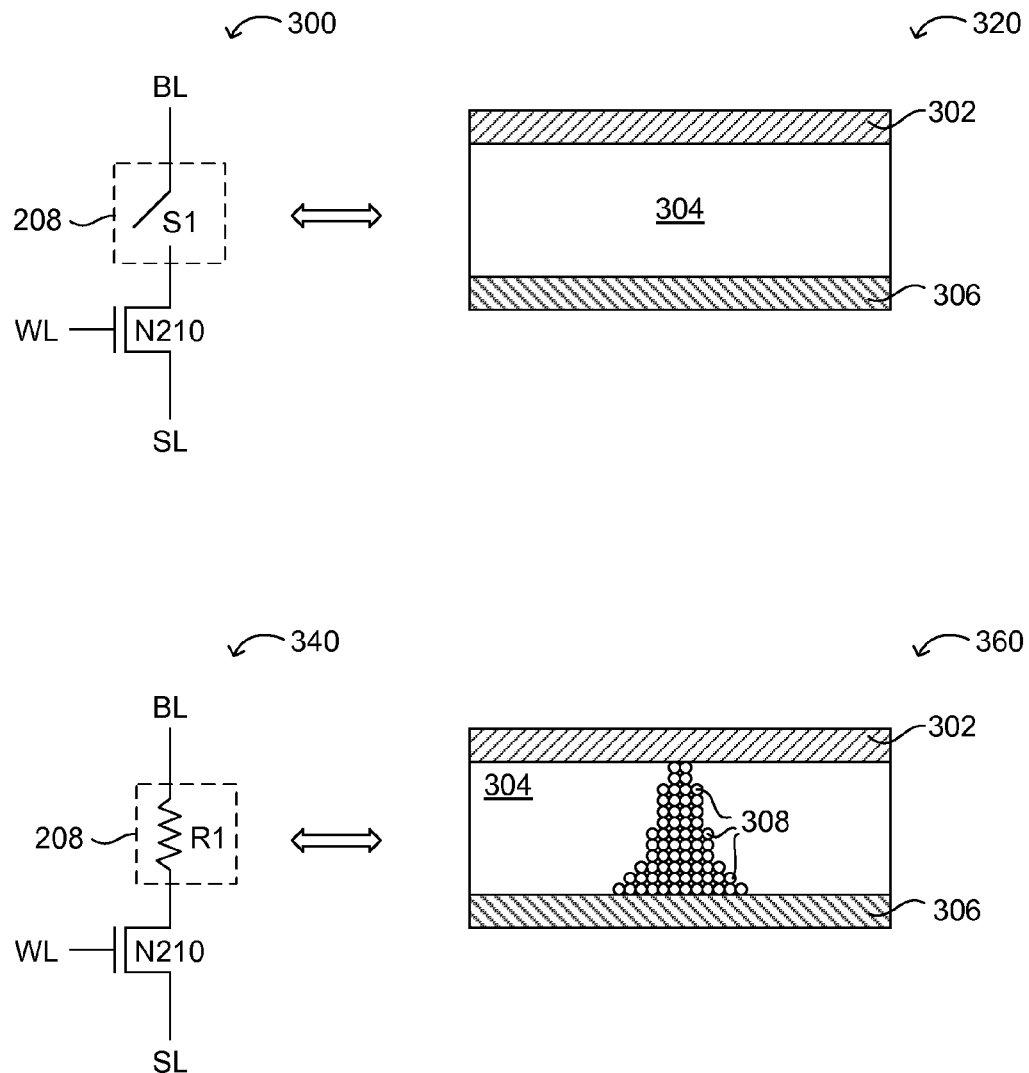
FIG. 3 is a diagram of an example programmable impedance element with schematic modeling.

Referring now to FIG. 3, shown is a diagram of an example programmable impedance element with corresponding schematic modeling. Example 300 shows a memory cell with an open switch S1 representation of PMC 208. The PMC portion of this representation corresponds to the cross-section diagram 320, which represents a PMC or programmable impedance element in a high impedance state (e.g., state "1"), or an erased state. Cross-section diagram 320 may also represent a "virgin" storage element state, whereby the PMC or programmable impedance element has not previously been effectively programmed. For example, a virgin storage element state may be one in which the memory cell has not been through a pre-conditioning or formation step where a formation voltage ($V_{FM}$) that is higher than a standard program voltage is used to initially program the cell. Partially dissolved or erased states may also be detected as a data state "1," or a multi-bit value, in some applications, and depending on the read-trip point. As used herein, "PMC" may be one example of a "programmable impedance element." In this example, PMC 320 can include electrochemically active electrode 302, solid electrolyte 304, and inert electrode 306.

Schematic representation 340 and corresponding cross-section diagram 360 show examples of PMC 208 in a low impedance state (e.g., state "0"), or a programmed state. Partial conductive paths may also be detected as a data state "0," or a multi-bit value, in some applications, and depending on the read-trip point. Example 340 shows a memory cell with a resistor R1 or closed switch representation of PMC 208. The PMC portion of this representation corresponds to the cross-section diagram 360. In the example 360, electrodeposits 308 can form in solid electrolyte 304 to form a "bridge" or conductive path between electrochemically active electrode 302 and inert electrode 306. For example, electrodeposits 308 can be from active electrode 302, and may include silver. As shown in examples 300 and 340, a control transistor (e.g., N210) can also be included in each memory cell including the programmable impedance element or PMC 208. For example, transistor N210 can be controlled by a word line 204, as discussed above with respect to FIG. 2.

PMC is based on a physical re-location of ions within a solid electrolyte (e.g., 304). A PMC memory cell or programmable impedance element may be formed of two solid metal electrodes 302 and 306, one relatively inert (e.g., 306) and the other electrochemically active (e.g., 302), with a relatively thin film of the electrolyte (e.g., 304) between the electrodes.

As shown in the cross-section diagrams herein, however, the solid electrolyte layer is shown as thicker than the electrodes for illustration purposes.

Solid electrolyte 304 can include a chalcogenide compound, such as a germanium selenium (Ge—Se) compound. Solid electrolyte 304 can be formed by photodissolution of metal into a chalcogenide base glass, Chalcogenide materials are chemical compounds consisting of at least one chalcogen ion (a chemical element in column VI of the periodic table, also known as the oxygen family). More precisely, the term chalcogenide refers to the sulphides, selenides, and tellurides. PMCs may utilize the ionic conduction of compounds containing metallic ions.

Certain metals can be added to thin films of chalcogenide glasses by photodissolution. When Ag is combined in this fashion with Ge—Se or Ge—S glasses, the resulting ternary may contain a dispersed nanocrystalline $Ag_2S(e)$ phase that has relatively large quantities of mobile metal ions. The presence of these ions allows the ternaries to act as solid electrolytes. If an anode that has an oxidizable form of the ionic metal and an inert cathode are applied in contact with such a phase-separated electrolyte, an ion current of mobile elements (e.g., positively charged metal ions) can flow under an applied voltage bias. Electrons from the cathode can reduce the excess metal due to the ion flux and an electrodeposit (e.g., 308) forms on or in the electrolyte (e.g., 304). Also, other materials, such as certain oxides (e.g., tungsten oxide, hafnium oxide, nickel oxide, titanium oxide, transition metal oxides, etc.), can be used, as opposed to Ge—S and Ge—Se chalcogenide glasses. In addition, other metals, such as copper, can be used in place of silver, for the electrochemically active electrode that supplies mobile ions.

Various materials can be utilized to form electrodes 302 and 306. For example, inert electrode 306 can include tungsten, and electrochemically active electrode 302 can include silver or copper. In operation, when a negative bias is applied to inert electrode 306, metal ions in solid electrolyte 304, as well as some originating from the now-positive active electrode 302, can flow in solid electrolyte 304, and are reduced or converted to atoms by electrons from inert electrode 306. After a relatively short period of time, the ions flowing into the filament form a small metallic effective "nanowire" or conductive path between the two electrodes. Such a nanowire can lower the resistance along the conductive path between electrodes 302 and 306, as represented by the open switch model in schematic 300 and the resistor model in schematic 340. Also, the lowered resistance across electrodes 302 and 306 can be measured to indicate that the writing or programming process is complete.

Such a nanowire may not be a continuous wire, but rather a chain of electrodeposit islands or nanocrystals (electrodeposits) 308. A conductive path between the electrodes may appear as more of the chain of electrodeposits under certain operating conditions, particularly at relatively low programming currents (e.g., less than about 1 μA). However, higher programming currents can lead to a mostly metallic conductor or conduction path. Also, and as discussed above, reading the cell data can include switching on the control transistor (e.g., N210), and applying a relatively small voltage across the cell. If a nanowire is in place in that cell (e.g., 360), the resistance can be relatively low, leading to higher current, and that can be read as a "0" data value stored in that cell. However, if there is no nanowire or conductive path between electrodes in the cell (e.g., 320), the resistance is higher, leading to low current, and that can be read as a "1" data value stored in that cell. Of course, the definitions of "0" and "1" data values versus resistance levels can be reversed in some applications.

Cell data can be erased in similar fashion to cell writing or programming, but with a positive bias on the inert electrode. The metal ions will then migrate away from the filament, back into the electrolyte, and eventually to the negatively-charged active electrode (e.g., 302). This action dissolves the electrodeposits 308 in solid electrolyte 304, and increases the resistance again (e.g., as shown in schematic representation 300). In this way, an erase operation of a PMC can be substantially symmetric to a program or write operation.

Thus in conductive bridging random-access memory (CBRAM) applications, metal ions can dissolve readily in the material (e.g., 304) between the two electrodes (e.g., 302 and 306). In contrast, in resistive RAM (ReRAM) applications, the material between the electrodes may require a high electric field that can cause local damage in may produce a trail of conducting defects (a "filament"). Thus, for CBRAM, one electrode provides the dissolving ions, while for ReRAM, a one-time "forming" step may be required to generate the local damage.

However, many CBRAM/ReRAM program operations may not remain effective after certain high temperature processes. For example, a surface-mount technology (SMT) process whereby semiconductor memory device components are mounted on a PCB can cause degradation in the conductive path of electrodeposits 308 formed between electrodes 302 and 306. Thus, such a high temperature process may cause the resistance between these electrodes to increase, potentially putting a stored data state of "0" at risk.

Example Method of Safeguarding Data

In one embodiment, a method of recovering data in a semiconductor memory device, can include: (i) pre-conditioning a first memory cell on the semiconductor memory device by using a formation voltage to program a first data state in the first memory cell; (ii) storing a second data state in a second memory cell on the semiconductor memory device by maintaining the second memory cell in a virgin state; (iii) mounting the semiconductor memory device on a PCB by using a high temperature process that increases a resistance of the first memory cell; and (iv) performing a recovery of the first data state by reducing the resistance of the first memory cell.

For example, such a high temperature process can include an SMT process where the semiconductor memory device is soldered onto a PCB. In some cases, the device may be exposed to temperatures of, e.g., about 250° C. for a time from about 5 to 10 minutes. Particular embodiments may be directed to retaining initial data written into the device, or data states otherwise on the device, through this high temperature process by performing a recovery operation. For example, certain applications (e.g., firmware), desire the semiconductor memory device or chip (e.g., CBRAM, ReRAM, etc.) to be programmed prior to the SMT process. In another consideration, cost reductions can occur if chips are programmed at wafer level, which is also prior to the SMT process. Other considerations can include asserting control over code or firmware by programming data prior to the SMT process such that a subsequent or end user does not have access to the code/firmware.

Figure 4:
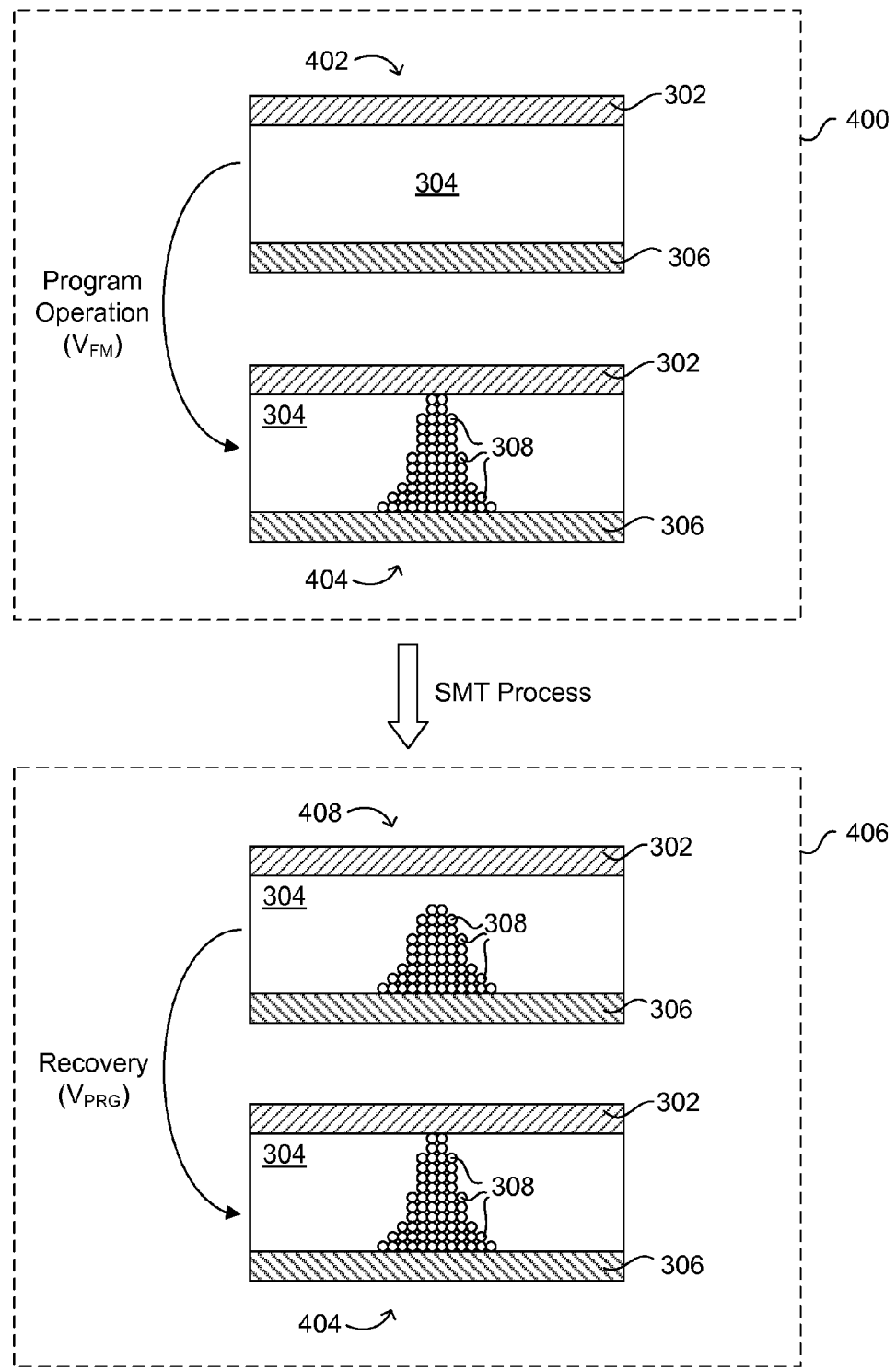
FIG. 4 is a diagram of example programmable impedance element characteristics before and after an SMT process.

Referring now to FIG. 4, shown is a diagram of example programmable impedance element characteristics before and after an SMT process. In box 400, an example pre-SMT program operation is shown. For example, cross-section diagram 402 shows a virgin PMC state prior to pre-conditioning or formation of the memory cell. Example diagram 404 shows a programmed cell resulting from use of a formation voltage ($V_{FM}$) as part of a pre-conditioning step. In this case, a conductive path of electrodeposits 308 may be fully formed in solid electrolyte 304 between electrodes 302 and 306.

An example SMT process can subject the semiconductor memory device (e.g., CBRAM) through a high temperature cycle or process (e.g., at about 250° C.) for a period of about 5 to 10 minutes, or more. After this process, the CBRAM may lose some of the stored data by degradation of the conductive path previously programmed. Box 406 shows an example post-SMT status and associated recovery operation. In this example, cross-section diagram 408 may show a degraded conductive path of electrodeposits 308 between electrodes 302 and 306. As a result, the cell resistance may increase, making the stored data look more like a "1" data value rather than the programmed "0" data value of example 404.

In particular embodiments, various characteristics of programmable impedance elements storing data on a CBRAM prior to SMT process may be used recover the stored data after the SMT process. For example, various data states may be stored on a virgin CBRAM at wafer sort or via packaged parts. If a particular cell is assigned a data value "1" (e.g., a high resistance state), then that cell is maintained as a virgin cell. On the other hand, if a particular cell is assigned a data value "0" (e.g., a low resistance state), then a formation step is performed to program the cell, as shown in box 400. In box 406, the recovery process can include a recovery program step (e.g., using program voltage $V_{PRG}$) to all cells in an array to restore retention loss on the data value "0" cells by enhancing conductive paths between electrodes 302 and 306. For cells having previously been programmed to a low resistance data value (e.g., "0") prior to the SMT process, this recovery program step can enhance or fully restore the conductive path, as shown in going from 408 back to 404 in box 406. It is noted that program voltage $V_{PRG}$ may be less than formation voltage $V_{FM}$. The recovery step may have relatively low impact on virgin cells or cells with a data value "1" stored therein, thus no substantial conductive path would be formed between electrodes 302 and 306 for these cells, resulting in a retained data state (e.g., "1").

Particular embodiments can support various types of recovery operations. For example, and as will be discussed in more detail below, recovery operation types can include refresh, differential sensing, and a combination of differential sensing and refresh. In order to manage such recovery operations for a given device, registers and recovery operation control circuitry can be employed. Examples of an approach for register-based recovery operation control will now be discussed with reference to FIGS. 5 and 6.

Figure 5:
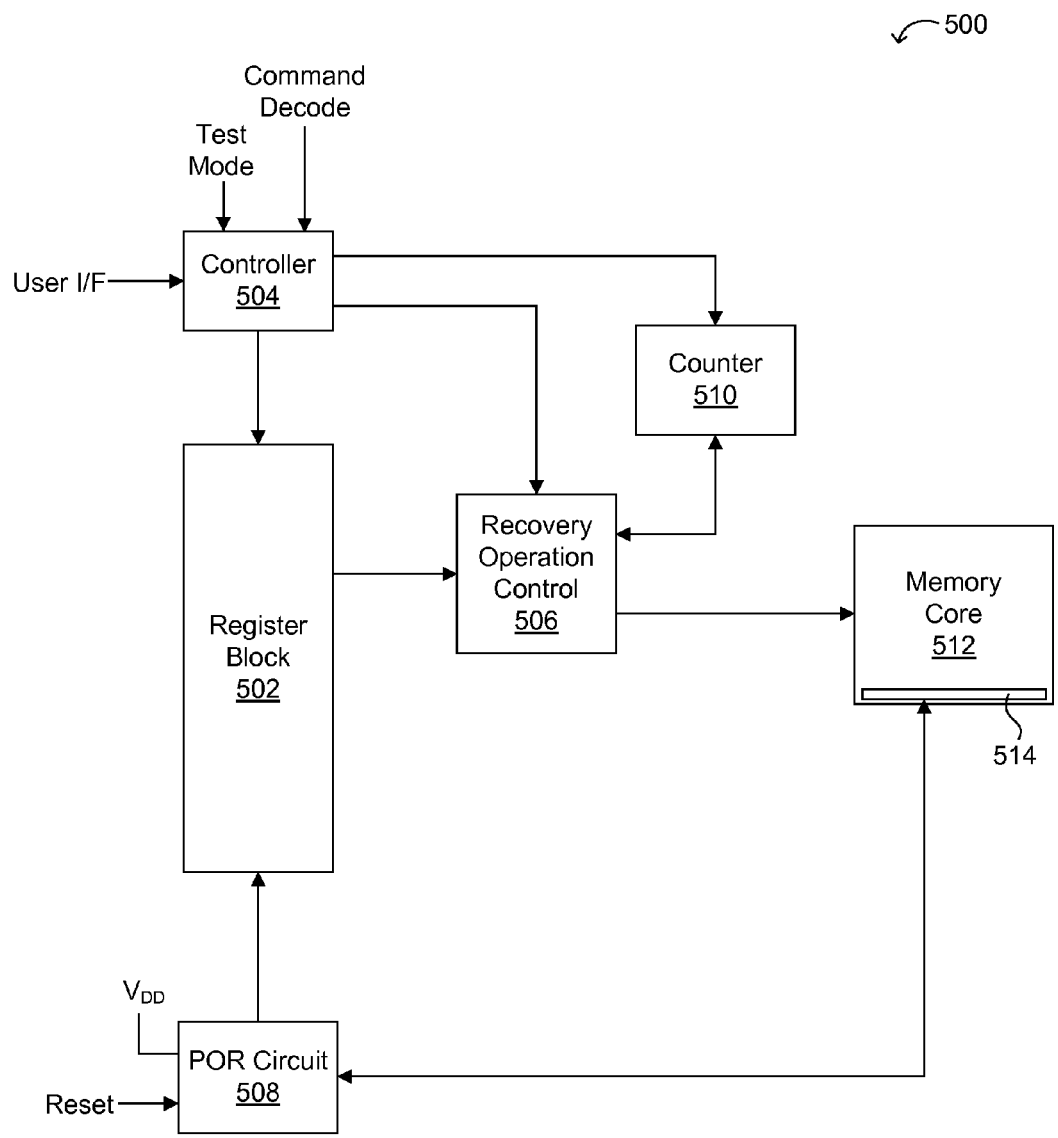
FIG. 5 is a schematic block diagram of an example register, control, and memory array structure, in accordance with embodiments of the present invention.

Referring now to FIG. 5, shown is a schematic block diagram 500 of an example register, control, and memory array structure, in accordance with embodiments of the present invention. For example, register block 502 can be implemented using static random access memory (SRAM). Register block 502 can provide recovery selections to recovery operation control 506. Controller 504 may determine and decode the received command, and can also control access to the register bits in register block 502. In addition, test modes (e.g., to determine distribution, etc.) can be used to override data in register block 502. Settings for register block 502 may be based on various default recovery operation settings, but can also be programmed on lot-by-lot or device-by-device basis. Also, counter 510 may be used to count a number of recovery operation commands that are performed on the device. For example, a predetermined number (e.g., 3, 4, etc.) of such commands may be allowed to be performed on a given device, and any recovery commands provided after the count limit is reached can be suppressed.

Power on reset (POR) circuitry or state machine 508, which can receive a reset signal, can access designated register data portion 514 and read out data from that dedicated section of memory array 512. Designated register data portion 514 may alternatively be located outside of memory core 512. In any event, this accessed data that is associated with memory core 512 may then be loaded into register block 502. In this way, information specific to this device can be programmed into the memory core, and whenever the device is powered on (e.g., as detected by $V_{DD}$ supply) or otherwise reset, this data can be loaded into register 502. This is because the memory core, including designated register data portion 514 may include non-volatile memory. Also, different applications-based information can be stored in non-volatile memory designated register data portion 514. Further, different parts or memory cores 512 can be independently programmed (e.g., for different applications, etc.). In some cases, this dedicated portion of memory may not be accessible to the user. However, some applications may allow access to these designated locations, such as in a test mode.

Also, the non-volatile memory cells in designated register data portion 514 may be substantially identical to those in a remaining portion of memory core 512. For example, memory core 512 can include a plurality of memory cells that each can include a programmable impedance element or PMC. However, in some cases there may be some variety between the cells (e.g., programmable impedance element-based cells) of designated register data portion 514 relative to the cells found in other portions of memory core 512. For example, the cells of designated register data portion 514 may have a substantially similar structure relative to the other cells, but in order to accommodate higher retention for the critical data stored therein, such as through high temperature processes, the cells of designated register data portion 514 may be varied so as to provide improved retention.

In one or more test modes, controller 504 can override one or more values stored in register 502. When the test mode is complete, data in register block 502 can revert to the data that was previously stored in the register. For example, registers 502 may be implemented as two storage bits per register cell, one such bit representing an override value that is only enabled during predetermined modes (e.g., test mode, etc.), and another bit storing the data programmed outside of the test mode (e.g., during normal operation, power up, etc.). As another example, registers 502 may be implemented as a single bit per cell or stored data bit, and data can be reverted to its previous state by accessing designated register data portion 514 and asserting the reset signal upon completion of the test mode.

In addition, registers 502 may be programmable by controller 504 and/or by a user via a separate or combined user interface. In this way, a user may be able to program data into registers 502 in order to override or change previous values therein. Particular embodiments may also support independently controlled program/erase algorithm selection for different memory cores 512. For example, controller 504 can set the register values in 502 different for different memory cores 512. For example, register block 502 may include dedicated sectors (e.g., a widened register or increased register bit length) for each memory core, or register block 502 may be replicated for each memory core 512. This may be utilized whereby one memory array 512 is dedicated to one application (e.g., code), while another memory array 512 may be dedicated to another application (e.g., data). In this way, register block 502 may accommodate independently programmable operation algorithms in support of different operations for different memory cores 512.

Figure 6:
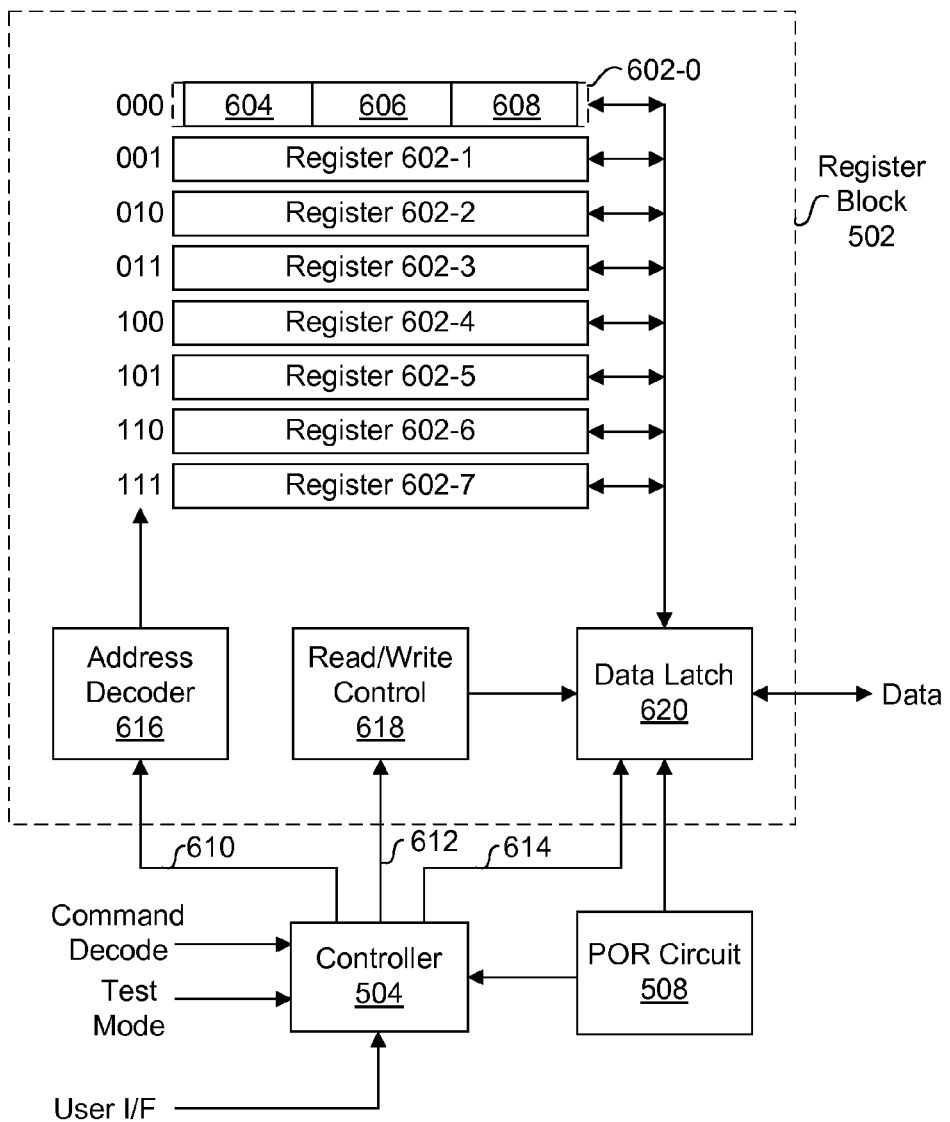
FIG. 6 is a schematic block diagram of an example register control structure in accordance with embodiments of the present invention.

Referring now to FIG. 6, shown is a schematic block diagram 600 of an example register control structure in accordance with embodiments of the present invention. In this example, register block 502 can include eight registers 602 (e.g., 602-0, 602-1, . . . 602-7). Each register 602 can include a number of fields. For example, field 604 may be a 2-bit wide field to store data representing a type (e.g., refresh, differential sensing, etc.) of recovery operation. Also for example, field 606 may be a 2-bit wide field of flag bits to store a maximum count or iteration of recovery commands that are allowed. Also for example, field 608 may be a 2-bit wide field to store data (e.g., voltage level settings, etc.) utilized in a given recovery operation. Register block 502 can also include address decoder 616, which can receive signals 610 (e.g., address, address load, etc.) from controller 504, and may provide 3-bit decoded values to address one of eight registers 602. Read/write control 618 can receive signals 612 (e.g., read control signal, write control signal, etc.) from controller 504, and may provide a control signal to data latch 620. Data latch 620 can receive signals 614 (e.g., read data strobe, data out enable, load data, etc.) from controller 504, and may receive or provide the data to/from register block 502.

Particular embodiments can also support an initial reset-based (e.g., via POR circuit 508) recovery operation, followed by subsequent command control being given to a user (e.g., via test mode, user interface, etc.). Also, because an SMT process is typically a one-time operation, flag bits (e.g., field 606) can be used to limit a number of times that a recovery type command can be issued. Further, other options can be employed to indicate that a device has been through SMT in order to limit usage of recovery operation commands to post-SMT. For example, a designated pin may be connected to a predetermined supply upon connection to a PCB to indicate to the device that the SMT process has occurred. In some applications (e.g., one-time programmable (OTP) products), recovery operations may be expanded to be activated at any time so long as some cells remain in a virgin state, or an otherwise suitably high resistance state. Particular embodiments may also be suitable for embedded applications whereby new recovery operation commands can be defined without having to comply with standalone product specifications.

Also, while only eight registers are shown in the particular example of FIG. 6, any suitable number of registers can be accommodated in particular embodiments. For example, 24 registers can be included, where each register is 8-bits wide. In addition, such registers may support other programmable impedance device-based functions, such as word line voltage level, compliance current (e.g., where the cell is programmed until reaching this compliance current, X μA), equalization pulse width, single ended or differential sense amplifier configuration, as well as any number of other device functions and/or parameters.

Figure 7:
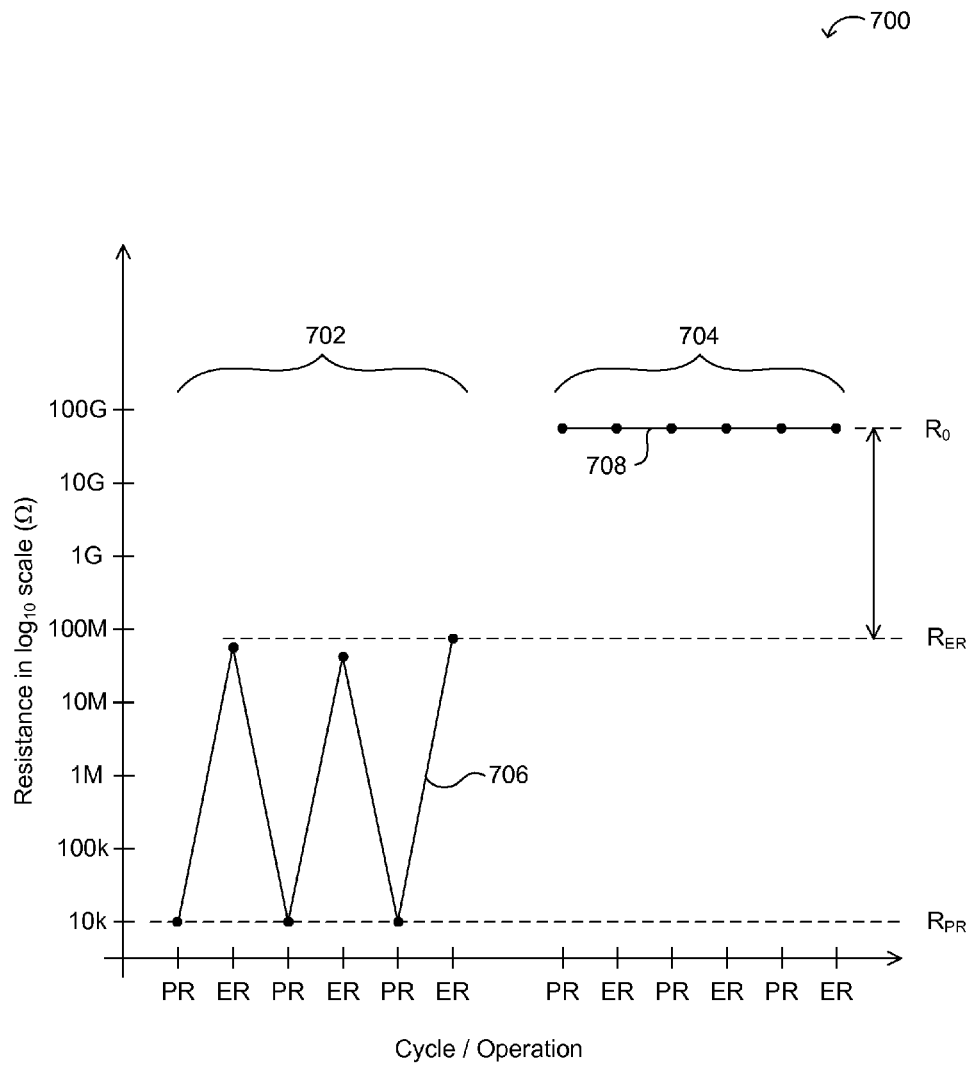
FIG. 7 is a diagram of an example cell resistance based on virgin cell status or a pre-conditioned cell, in accordance with embodiments of the present invention.

Referring now to FIG. 7, shown is a diagram 700 of an example cell resistance based on virgin cell status or a pre-conditioned cell, in accordance with embodiments of the present invention. In particular example 702, shown is resistance data for a cell that has been pre-conditioned and has undergone a high temperature process (e.g., 260° C. for 13 minutes). As shown in waveform 706, a cycling of a program operation (PR) may reduce the cell's resistance to $R_{PR}$ (e.g., about 10 KΩ), and an erase operation (ER) may increase the cell's resistance to $R_{ER}$ (e.g., about 100 MΩ). In example 704, shown is resistance data for a virgin cell that has not been pre-conditioned or programmed using formation voltage $V_{FM}$, but has also undergone such a high temperature process. As shown in waveform 708, attempts to program or erase the cell may not substantially change the resistance from the virgin cell resistance of $R_0$ (e.g., greater than about 10 GΩ). Thus, the cell exemplified in 704 may not be a programmable cell using the given cycling conditions, and this cell may need to go through a formation step before it can effectively be programmed.

Table 1 below shows example resistances and program voltages for cells in various states. As can be seen, the post-SMT resistance for a virgin cell can be maintained at about $R_0$, as indicated in waveform 708. However, it is not clear whether the post-SMT resistance (e.g., programmed resistance $R_{PR}$ or erased resistance $R_{ER}$) for non-virgin cells will remain consistent with the associated pre-SMT resistance.

TABLE 1

| State | Pre-SMT Resistance | Pre-SMT Program Voltage | Post-SMT Resistance | Post-SMT Program Voltage |
|---|---|---|---|---|
| Virgin Cells | $R_0$ | $V_{FM}$ | $R_0$ | $V_{FM}$ |
| Non-Virgin Cells (programmed) | $R_{PR}$ | $V_{PRG}$ | $R_{PR}$? | $V_{PRG}$ |
| Non-Virgin Cells (erased) | $R_{ER}$ | $V_{PRG}$ | $R_{ER}$? | $V_{PRG}$ |

As discussed above, non-virgin cells are cells that have been through the complete formation or pre-conditioning step at least once. $V_{FM}$ is formation program voltage of virgin cells, and thus is the necessary voltage to sufficiently program a virgin cell to complete the conductive path between active and inert electrodes. Once the formation step has occurred and the cell is thus non-virgin, the normal program voltage of $V_{PRG}$ can be used, such as to re-program a cell after an erase. The formation or pre-conditioning step may effectively be strong programming to form a conductive path (see, e.g., 404). This pre-conditioning may be stronger than regular cycling of program operations, and thus may only need to be performed once. The formation voltage $V_{FM}$ can be in a range from about 2.5 V to about 3 V, such as about 2.7 V, and the regular programming voltage $V_{PRG}$ can be in a range of from about 1 V to about 1.5 V. Thus, formation voltage $V_{FM}$ may be higher than the regular program voltage $V_{PRG}$.

As shown in example 704, virgin cells may have a relatively high $R_0$ resistance, and with no pre-conditioning, this cell resistance may also remain substantially the same $R_0$ after the SMT process. A non-virgin cell that has already gone thru the formation step using $V_{FM}$ can subsequently be cycled using regular program voltage $V_{PRG}$. However, after SMT, there may be a change in the cell resistance for these non-virgin cells. Some percentage or distribution of resistance variations can occur for a given array of memory cells, such as about 60% within a threshold but still detectable as a programmed cell, and about 40% above the threshold and thus appearing as an erased cell. As a result, after SMT it may be difficult to distinguish between programmed and erased non-virgin cells. Further process development and/or process tuning may be utilized to increase the difference between the program voltages required for erased or programmed non-virgin cells after SMT in order to distinguish the intended data for recovery.

Particular embodiments also support data distinguishing based on virgin and non-virgin cell status. The basis for this differentiation can be seen in the difference between resistances $R_0$ (for a virgin cell) and $R_{ER}$ (a highest resistance for a non-virgin cell). In this way, virgin cells can be detected as a data state "1" and non-virgin cells can be detected as a data state "0" after the SMT process. Thus, a pre-SMT program operation can be facilitated by simply leaving virgin cells alone in order to effectively store "1" data states therein, and by only programming the non-virgin cells.

Figure 8:
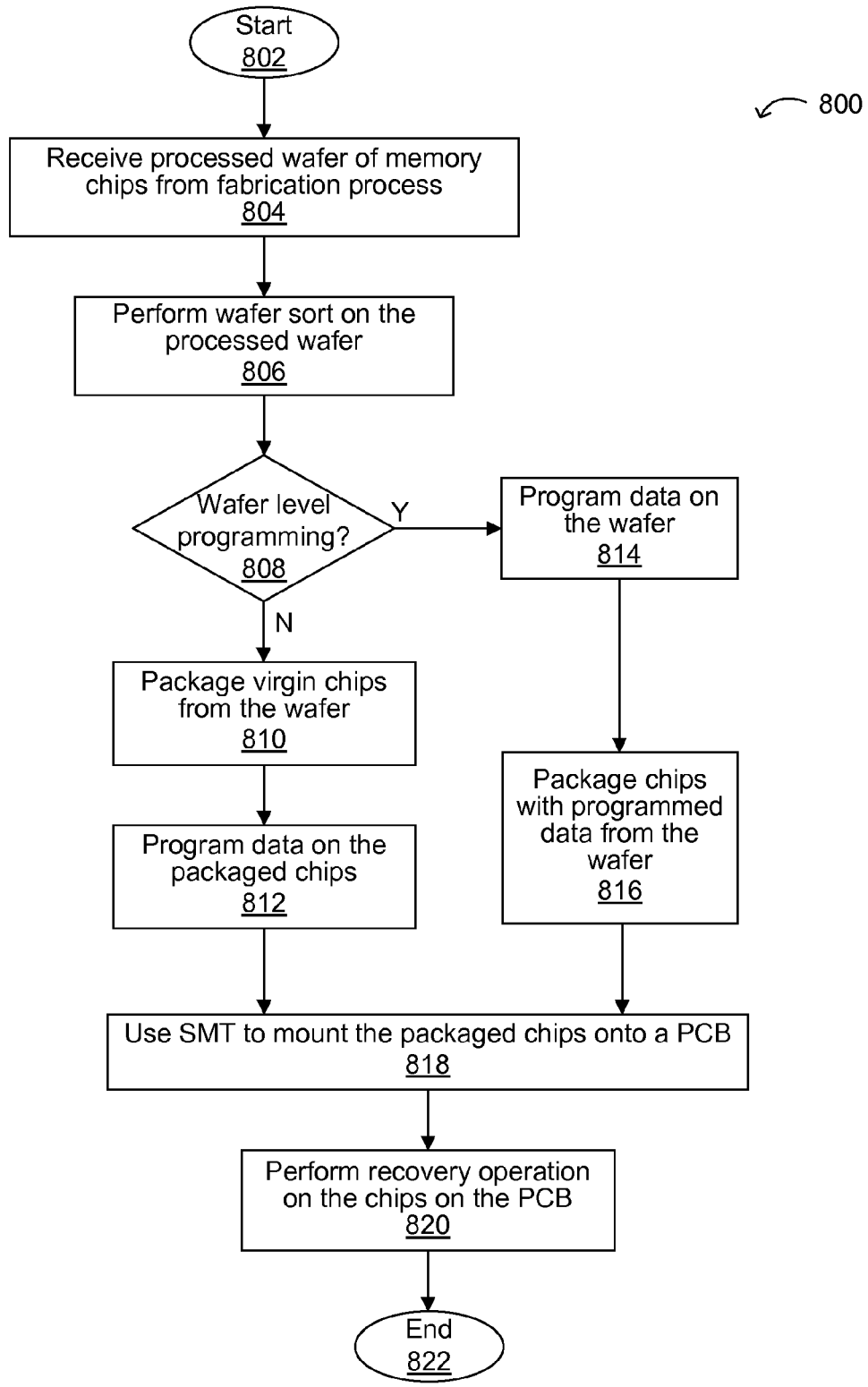
FIG. 8 is a flow diagram of an example wafer, SMT, and recovery process, in accordance with embodiments of the present invention.

Referring now to FIG. 8, shown is a flow diagram 800 of an example wafer, SMT, and recovery process, in accordance with embodiments of the present invention. The flow begins at 802, and at 804 a processed wafer of memory chips can be received from wafer fabrication. At 806, wafer sort can be performed on the processed wafer. If programming is to be done at the chip level (808), virgin chips from the wafer can be packaged at 810. At 812, data can be programmed on the packaged chips, thus making some of the memory cells therein non-virgin. However, if programming is to be done at the wafer level (808), data can be programmed on the wafer at 814. At 816, chips with programmed data from the wafer can then be diced and packaged. In any event, SMT may be used to mount the packaged chips onto a PCB at 818. At 820, due to potential cell conductive path degradation due to the high temperature process, a recovery operation can be performed on the chips on the PCB, completing the flow at 822.

As discussed above, various types of recovery operations can be supported in particular embodiments. For example, each type of recovery operation may utilize maintenance of data state "1" as virgin cells. As such, a post-SMT program algorithm can include the formation step using a higher formation voltage $V_{FM}$ for a first-time programmed cell to change from a "1" to a "0" data state. In addition, various triggers for recovery operations (e.g., a refresh operation) can include POR, a separate command, etc., as discussed above. Also, for refresh type recovery operations, this refresh time may be visible to user, and as such, subsequent commands may need to wait until the refresh is complete. In addition, differential sensing type recovery operations may utilize a 2× cell redundancy whereby one cell stores a data "1" (e.g., a virgin cell), and its paired cell stores a data "0" value.

In particular embodiments, test time can be reduced by retaining cells in their virgin states post-SMT process. Virgin cells may have a behavior different than a cell that has already been programmed. This is exemplified by the gap between resistances $R_0$ and $R_{ER}$ in FIG. 7, whereby the virgin cell exhibits a substantially flat resistance line.

Figure 9:
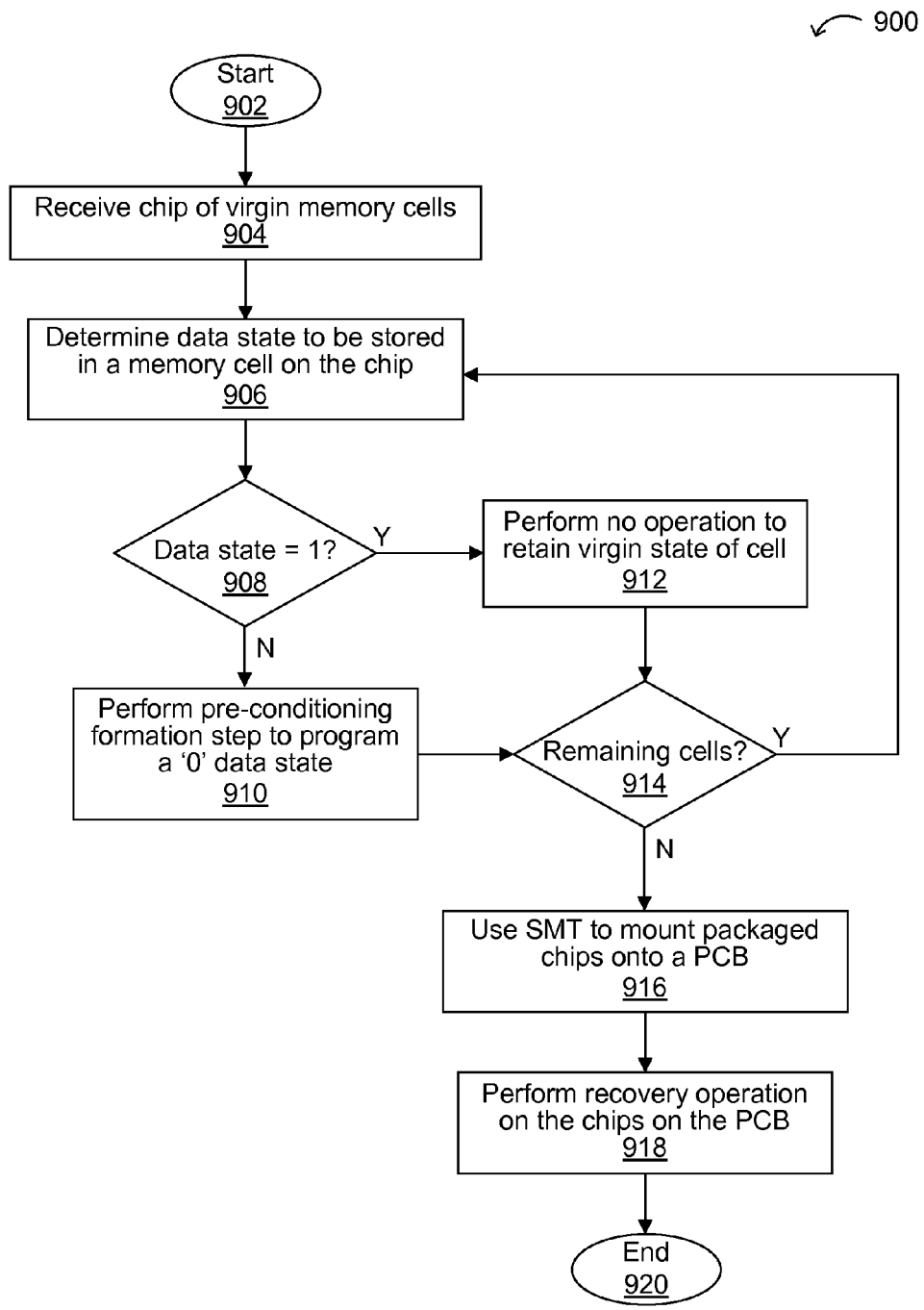
FIG. 9 is a flow diagram of an example data state based recovery operation in accordance with embodiments of the present invention.

Referring now to FIG. 9, shown is a flow diagram 900 of an example data state based recovery operation in accordance with embodiments of the present invention. The flow can begin at 902, and a chip of virgin memory cells may be received at 904. At 906, a data state to be stored in a memory cell on the chip can be determined. If the data state to be stored is a "1" state (908), no operation may be performed in order to retain the virgin state of the cell at 912. If there are remaining cells (914), the flow may return to determine a data state to be stored at 906. However, if the data state to be stored is a "0" state, pre-conditioning formation may be performed to program the "0" data state at 910. If there are remaining cells (914), the flow may return to determine a data state to be stored at 906. However, if all the cells to be addressed on the array or chip are in a desired data state, the chip may be ready for mounting or packaging. For example, at 916 SMT may be used to mount packaged chips onto a PCB. At 918, a recovery operation may be performed on the chips mounted on the PCB, completing the flow at 920.

Thus, if a data value of "1" is to be written in a given cell, the cell may be left as a virgin (e.g., no pre-conditioning or formation step on that cell). However, if a data value of "0" is to be written in a given cell, then that cell can be programmed with a formation step (e.g., by using a higher formation voltage $V_{FM}$). In a recovery operation, such as a refresh type operation, a program of the data with the lower $V_{PRG}$ can be performed. Any cell that has been effectively programmed before SMT, where some of that conductive path has been degraded via the SMT high temperature process, can suitably be recovered as a programmed cell (e.g., data state "0") due to sufficiently low resistance. Thus, unless a virgin cell has been programmed with the formation step or pre-conditioning (thus changing that cell to a non-virgin cell), that cell may not be programmable with a lower regular program voltage $V_{PRG}$.

Some applications repeatedly cycle program and erase operations prior to supplying a semiconductor memory device to a customer, where the customer would then program data/application into the device. However, particular embodiments can reduce this cycle time by programming the data/application of the customer (e.g., via a customer format file) as certain "0" data states into the device, while retaining some virgin cells for the "1" data states. In this way, virgin versus non-virgin cell status can be utilized in the recovery operation due to be substantially higher resistances seen in the virgin cells.

Figure 10:
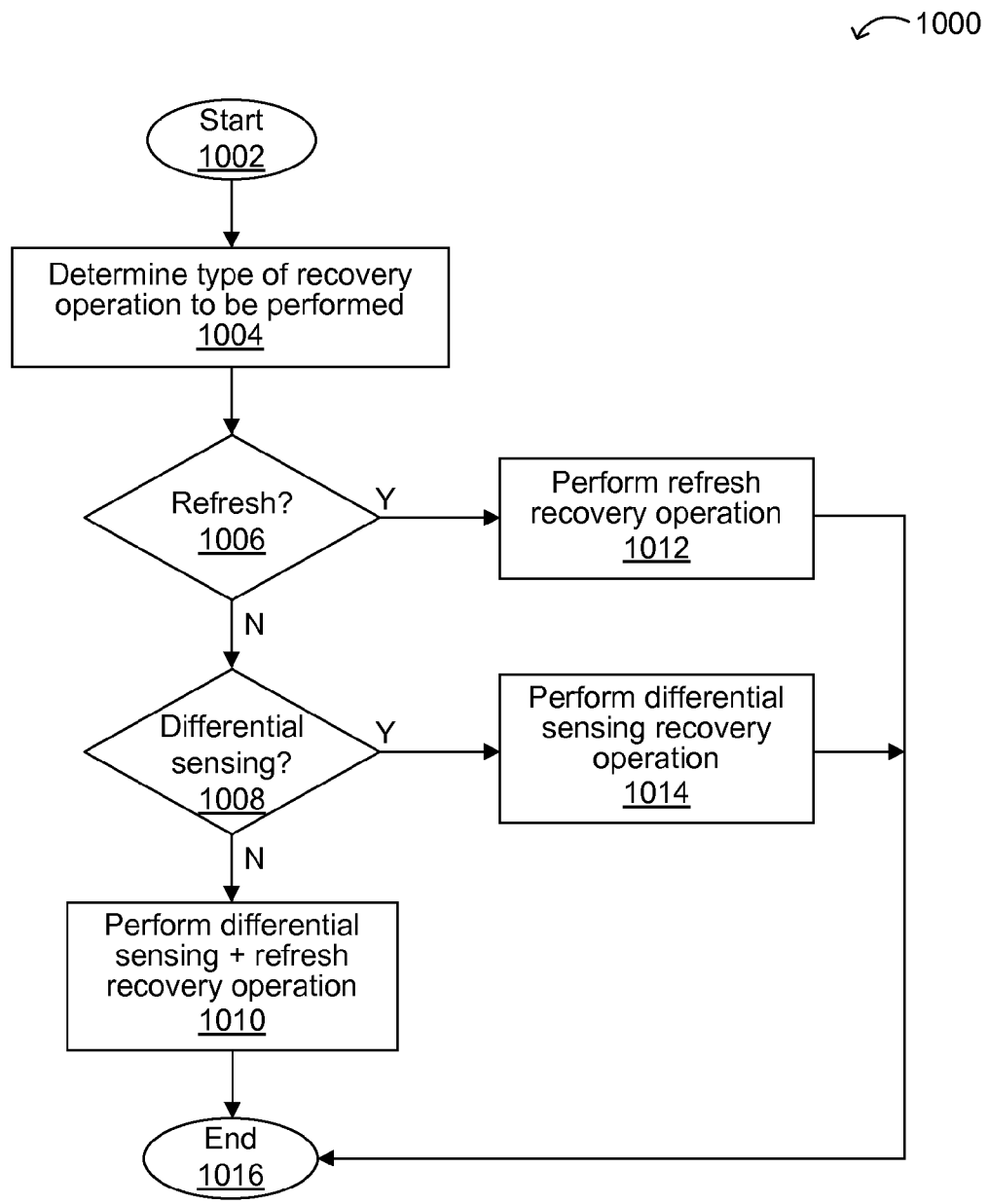
FIG. 10 is a flow diagram of example types of recovery operations in accordance with embodiments of the present invention.

Referring now to FIG. 10, shown is a flow diagram 1000 of example types of recovery operations in accordance with embodiments of the present invention. The flow can begin at 1002, and a type of recovery operation to be performed can be determined at 1004. For example, various bits from register block 502 may be accessed in order to determine the type of recovery operation to be utilized. If a refresh type of recovery operation is to be used (1006), the refresh recovery operation can be performed at 1012, completing the flow at 1016. On the other hand, if a differential sensing type of recovery operation is to be used (1008), the differential sensing recovery operation can be performed at 1014, completing the flow at 1016. In differential sensing, a user of the device may not have to wait for a substantial recovery time because the resistance difference may always be sensed without the need for a refresh. If neither of these types of recovery operations are to be performed (1006, 1008), then a combination differential sensing and refresh type of recovery operation can be performed at 1010, completing the flow at 1016. For example, the combination recovery operation may include a refresh operation followed by differential sensing whereby differential storage of a pair of cells (with one of those cells being a virgin cell) is utilized.

Figure 11:
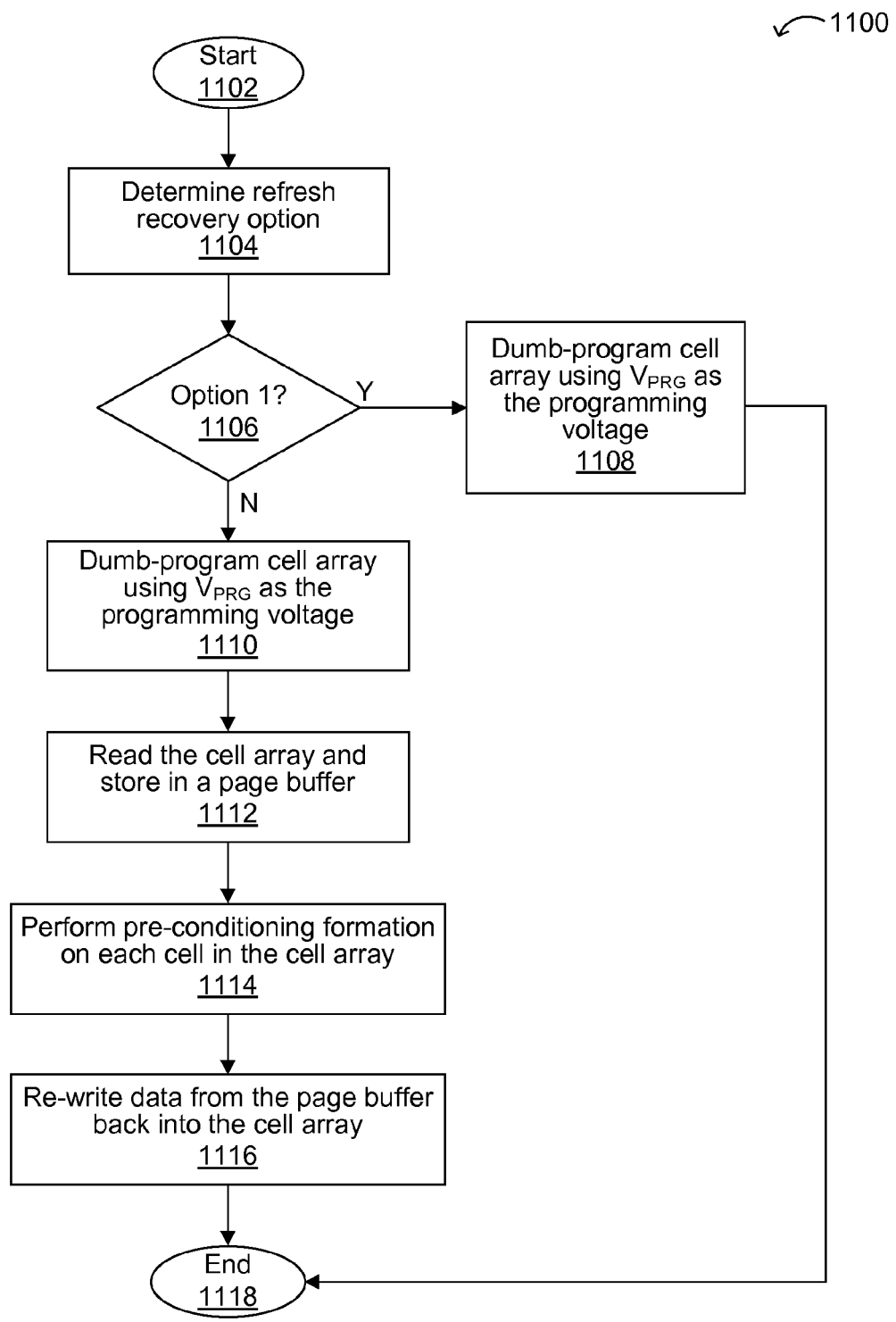
FIG. 11 is a flow diagram of an example refresh recovery operation in accordance with embodiments of the present invention.

Referring now to FIG. 11, shown is a flow diagram 1100 of an example refresh recovery operation in accordance with embodiments of the present invention. The flow can begin at 1102, and a refresh recovery option can be determined at 1104. For example, if a first refresh option is determined (1106), a refresh operation including a "dumb-program" or complete programming of each cell in the cell array using $V_{PRG}$ as the programming voltage can be performed at 1108, completing the flow at 1118. If a second refresh option is determined (1106), a refresh operation including a dumb-program of the cell array using $V_{PRG}$ as the programming voltage can be performed at 1110. At 1112, the cell array may be read and stored in a page buffer. At 1114, a pre-conditioning formation may be performed on each cell in the cell array. At 1116, data from the page buffer can be re-written into the cell array, completing the flow at 1118.

Thus, for a refresh type of recovery operation, the program voltage $V_{PRG}$ can be utilized in a program operation for each cell. However, if a given cell is a virgin cell, the resistance of this cell may not substantially change despite the program operation because such a virgin cell has not been "formed" yet by way of a formation step. As such, the state of the virgin cells may not change in such a "dumb-program" refresh recovery operation that uses $V_{PRG}$ on all cells in a cell array.

Particular embodiments may also support differentiation by program voltage of non-virgin erased cells versus non-virgin programmed cells. For example, a program voltage of about 1 V may be used to program non-virgin programmed cells, and a program voltage of about 2 V may be used to program non-virgin erased cells. In this way, a window can be opened to also distinguish between non-virgin programmed and erased cells, thus providing more detailed recovery support.

Other configurations of memory cells or programmable impedance elements may also be utilized in order to facilitate data safeguarding through an SMT process. For example, PMCs may be stacked in a serial cell configuration in order to further increase formation voltage $V_{FM}$. Thus, cell structures that have been through this formation step prior to SMT may be made more easily identifiable. In one example case, one cell in a stack of cells may be an OTP type whereby the forming can effectively be permanent even after a high or prolonged temperature step, such as an SMT process.

Figure 12:
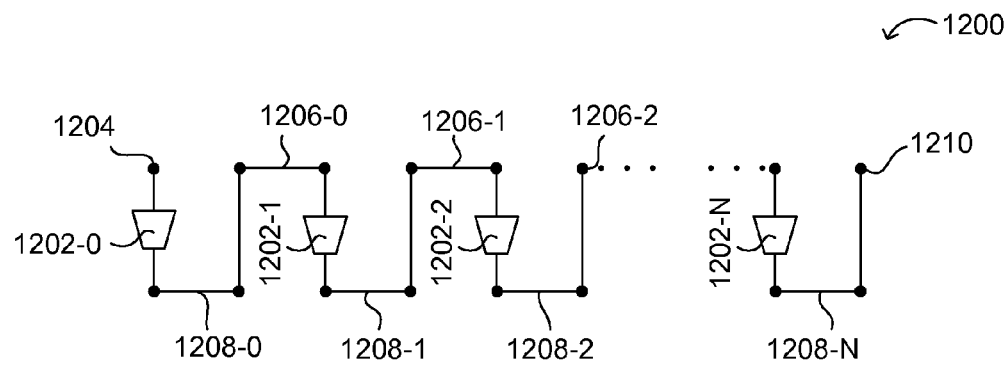
FIG. 12 is a schematic block diagram of an example chained programmable impedance element arrangement in accordance with embodiments of the present invention.

Referring now to FIG. 12, shown is a schematic block diagram 1200 of an example chained programmable impedance element arrangement in accordance with embodiments of the present invention. In this example, programmable impedance elements or PMCs 1202 (e.g., 1202-0, 1202-1, 1202-2, . . . 1202-N) can be stacked by way of top electrode 1206 (e.g., 1206-0, 1206-1, 1206-2, etc.) and bottom electrode 1208 (e.g., 1208-0, 1208-1, 1208-2, . . . , 1208-N) connections. For example, vias can be used to form connections between appropriate top electrodes 1206 and bottom electrodes 1208. In addition, a top cell pad 1204 can connect to a top electrode of top PMC 1202-0, and a bottom cell pad 1210 can connect to a bottom electrode of bottom PMC 1202-N, to form external or other connections to the chained programmable impedance element arrangement.

Figure 13:
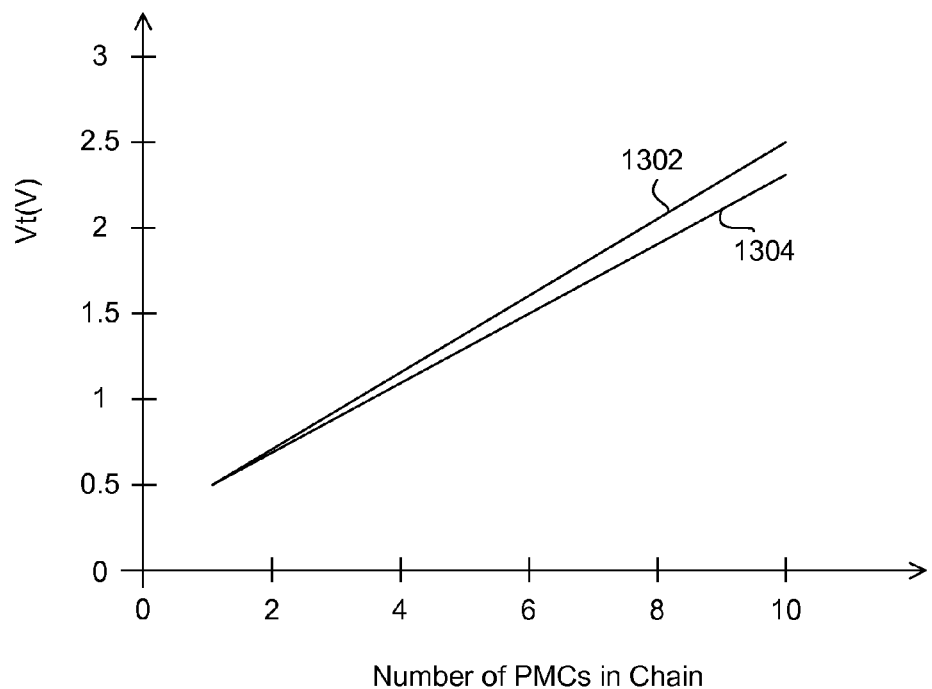
FIG. 13 is a graph diagram of an example threshold voltage versus chained arrangement in accordance with embodiments of the present invention.

Referring now to FIG. 13, shown is a graph diagram of an example threshold voltage versus chained arrangement in accordance with embodiments of the present invention. Waveform 1302 shows a threshold program voltage (e.g., formation voltage $V_{FM}$) versus a number (e.g., "N") of PMCs in a chained arrangement, for a compliance current of 200 µA. Waveform 1304 shows a threshold program voltage versus a number of chained PMCs for a compliance current of 50 µA. In any case, the threshold programming voltage can be increased as a number of programmable impedance elements in the chained structure is increased. Thus, such chained structures can be tailored in order to suit various program voltage values for different applications.

Figure 14:
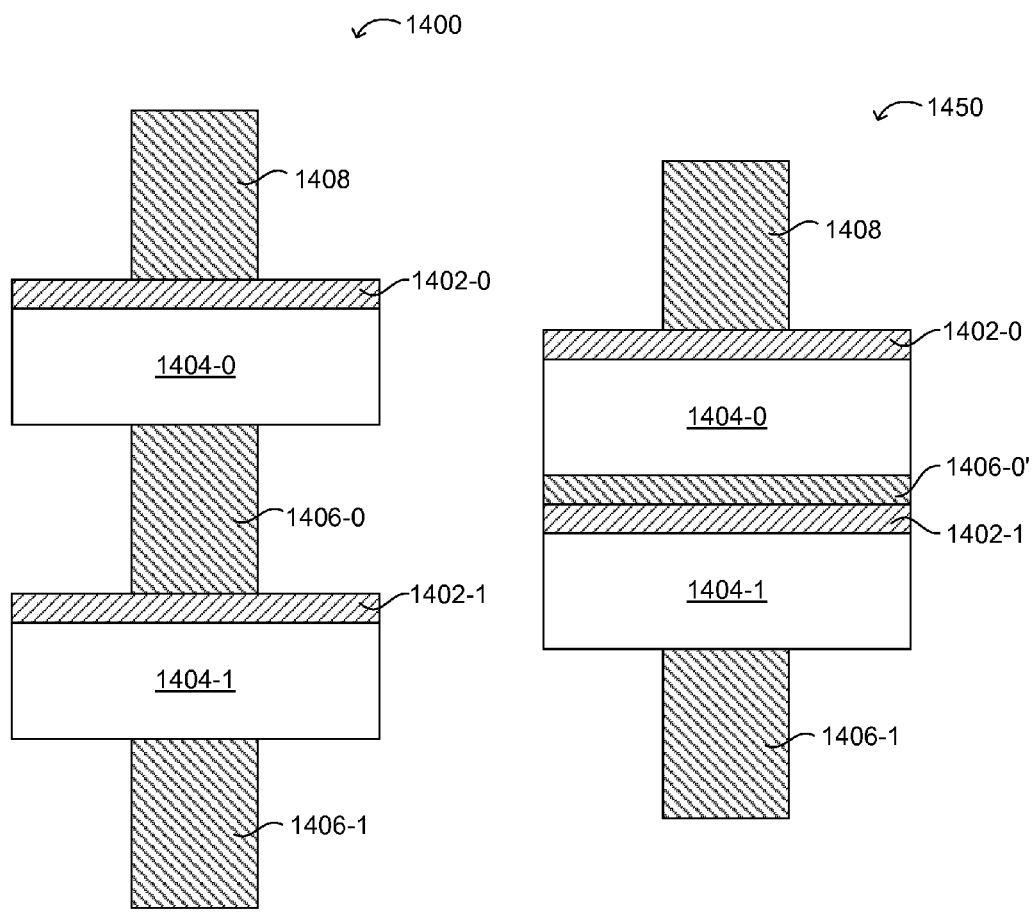
FIG. 14 is a diagram of example programmable impedance element chain structures in accordance with embodiments of the present invention.

Referring now to FIG. 14, shown is a diagram of example programmable impedance element chain structures in accordance with embodiments of the present invention. In examples 1400 and 1450, programmable impedance element stacked structures of two cells are shown. In 1400, external connections can be supported at electrode 1408, and PMC bottom electrodes 1406-0 and 1406-1. The programmable impedance element or PMC structures can also include top electrodes 1402 (e.g., 1402-0 and 1402-1) and solid electrolytes 1404 (e.g., 1404-0 and 1404-1). In 1450, bottom electrode 1406-0' may be a structure more closely corresponding to the solid electrolyte 1404-0 of the associated cell, without allowing for an external connection at that particular node.

Various combinations of types of programmable impedance elements can also be employed in particular embodiments. For example, one PMC (e.g., formed by top electrode 1402-0, solid electrolyte 1404-0, and bottom electrode 1406-0/1406-0') may be an OTP type cell (e.g., with a GeCu solid electrolyte), while another PMC (e.g., formed by top electrode 1402-1, solid electrolyte 1404-1, and bottom electrode 1406-1) in the stacked arrangement may be a regular type of PMC (e.g., with a GeS solid electrolyte). In one particular voltage example, a threshold program voltage for both cells can be about 2.5 V at about 1 ms prior to a high temperature (e.g., about 260° C. for about 10 min) process. However, the program voltage can be reduced (e.g. to about 1.5 V at about 1 ms) by only having to program one cell after the high temperature process. For example, this may be due to one of the two cells being either OTP and/or being able to survive the high temperature process. In this way, the stored data state prior to the high temperature process can be identified and recovered after the high temperature (e.g., SMT) process, such as by using techniques discussed above.

As discussed above, materials such as certain oxides (e.g., tungsten oxide, hafnium oxide, nickel oxide, titanium oxide, transition metal oxides, etc.), can be used as the solid electrolyte, as opposed to Ge—S and Ge—Se chalcogenide glasses. Such oxide-based solid electrolytes may require a formation voltage, while PMCs having other solid electrolyte materials may not necessarily require a formation voltage for initial programming. In any event, a stacked programmable impedance element arrangement can effectively induce a formation voltage, even when the PMCs in the stack utilize materials that would not otherwise necessitate the use of such a higher formation voltage for initial programming. In this way, particular embodiments are amenable to a wide variety of cell materials and structures.

Also in particular embodiments, a chained arrangement of programmable impedance elements may have characteristics whereby an erase of the chained cell structure may only erase one of the cells, even though each of the cells may have been programmed during the initial programming operation. This is because most of the erase voltage may be applied across the first cell in the stacked structure that is erased by a dissolved or sufficiently dissolved conductive path between top and bottom (active and inert) electrodes due to differences in cell resistances between an erased and programmed cell. Such is the case for the stacked cell structure including one or more OTP cells whereby the cell program operation can survive the SMT process, and further program and erase operations may only act on the non-OTP cell in the stacked arrangement.

In this way, identification of programmed cells prior to a high temperature (e.g., SMT) process can be identified after such a process for suitable recovery operations. Such a stacked programmable impedance element arrangement may also be used in other applications that can benefit from higher formation voltage structures. For example, portions of a memory array or device can be isolated from other memory portions based on stacked structures that yield higher formation voltages. In one example, access may be granted to areas of memory for debugging or part binning based on this formation or threshold program voltage difference. In another example, redundancy areas and/or other device features can be enabled based on these threshold differences.

It is also noted that, while only two storage states (state "0" and state "1") have been significantly described herein with respect to program and erase operations, PMCs may also each support more than one memory state. For example, depending on the voltage level controls, instead of a full erase or a full program/write, partial operations (e.g., by applying less/predetermined voltages for forward bias and reverse bias of the PMC) can be performed. Such partial operations can produce different resistance values in the cell, as opposed to the cell having an on/off resistance corresponding to two storage states. Instead, a binary coding of, e.g., eight different bands or ranges of PMC on resistances can be converted into 3-bit storage values. Thus in this example, eight different data values can be stored in a given PMC. Of course, other numbers of data values can be stored based on the resistance and bias voltage characteristics.

While the above examples include circuit and structural implementations of certain memory cells and programmable impedance devices, one skilled in the art will recognize that other technologies, methods, and/or cell structures can be used in accordance with embodiments. Further, one skilled in the art will recognize that other device circuit arrangements, architectures, elements, and the like, may also be used in accordance with embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of recovering data in a semiconductor memory device, the method comprising:
   a) pre-conditioning a first memory cell on the semiconductor memory device by using a formation voltage to program a first data state in the first memory cell;
   b) storing a second data state in a second memory cell on the semiconductor memory device by maintaining the second memory cell in a virgin state;
   c) mounting the semiconductor memory device on a printed-circuit board (PCB) by using a high temperature process that increases a resistance of the first memory cell; and
   d) performing a recovery of the first data state by reducing the resistance of the first memory cell.

2. The method of claim 1, wherein each of the first and second memory cells comprises a programmable metallization cell (PMC).

3. The method of claim 1, wherein the high temperature process comprises a surface-mount technology (SMT).

4. The method of claim 1, wherein the performing the recovery is initiated by a command received by the semiconductor memory device.

5. The method of claim 1, wherein the performing the recovery comprises performing a refresh on the first and second memory cells.

6. The method of claim 5, wherein the performing the refresh on the first and second memory cells comprises using a program voltage that is less than the formation voltage.

7. The method of claim 1, wherein the performing the recovery comprises performing differential sensing on the first and second memory cells.

8. The method of claim 1, wherein the performing the recovery comprises performing differential sensing and a refresh on the first and second memory cells.

9. The method of claim 1, wherein the performing the recovery comprises determining a type of recovery process to be performed, wherein the type comprises at least one of refresh, differential sensing, and a combination of differential sensing and refresh.

10. The method of claim 1, wherein each of the first and second memory cells comprises:

a) a programmable impedance element having an active electrode coupled to a bit line; and b) a transistor having a drain coupled to the inert electrode of the programmable impedance element, a gate coupled to a word line, and a source coupled to a source line.

11. The method of claim 1, wherein each of the first and second memory cells comprises a programmable impedance element having:

a) an inert electrode coupled to a first side of a solid electrolyte;

b) an active electrode coupled to a second side of the solid electrolyte, wherein the programmable impedance element is programmed by formation of a conductive path between the active and inert electrodes; and c) a plurality of mobile elements derived from the active electrode, wherein the plurality of mobile elements are reduced in the solid electrolyte to form the conductive path.

12. The method of claim 11, wherein the conductive path in the programmable impedance element is formed by application of a first voltage across the active and inert electrodes, the conductive path substantially remaining once formed after the first voltage is removed.

13. The method of claim 11, wherein at least a portion of the conductive path is dissolved to erase the programmable impedance element by application of a second voltage across the active and inert electrodes.

14. The method of claim 1, wherein the formation voltage is in a range of from about 2.5 V to about 3 V.

15. The method of claim 1, wherein the performing the recovery comprises using a program voltage in a range of from about 1 V to about 1.5 V.

16. The method of claim 1, wherein the high temperature process comprises a process of at least 250° C.

17. The method of claim 1, further comprising packaging the semiconductor memory device prior to the mounting on the PCB.

18. The method of claim 17, wherein the pre-conditioning the first memory cell occurs prior to the packaging.

19. The method of claim 17, wherein the pre-conditioning the first memory cell occurs after the packaging.

20. An apparatus for recovering data in a semiconductor memory device, the apparatus comprising:

a) means for pre-conditioning a first memory cell on the semiconductor memory device by using a formation voltage to program a first data state in the first memory cell;

b) means for storing a second data state in a second memory cell on the semiconductor memory device by maintaining the second memory cell in a virgin state;

c) means for mounting the semiconductor memory device on a printed-circuit board (PCB) by using a high temperature process that increases a resistance of the first memory cell; and d) means for performing a recovery of the first data state by reducing the resistance of the first memory cell.

* * * * *